US012803507B2

(12) United States Patent
Morikawa

(10) Patent No.: US 12,803,507 B2
(45) Date of Patent: Nov. 17, 2026

(54) RADIO-FREQUENCY CIRCUIT AND COMMUNICATION DEVICE

(71) Applicant: Murata Manufacturing Co., Ltd., Kyoto (JP)

(72) Inventor: Naoki Morikawa, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 357 days.

(21) Appl. No.: 18/436,798

(22) Filed: Feb. 8, 2024

(65) Prior Publication Data

US 2024/0283415 A1 Aug. 22, 2024

(30) Foreign Application Priority Data

Feb. 16, 2023 (JP) ................................ 2023-022257

(51) Int. Cl.
*H03F 3/19* (2006.01)
*H03F 1/02* (2006.01)
*H04B 1/00* (2006.01)

(52) U.S. Cl.
CPC ............. *H03F 3/19* (2013.01); *H03F 1/0211* (2013.01); *H04B 1/0053* (2013.01); *H03F 2200/294* (2013.01); *H03F 2200/451* (2013.01)

(58) Field of Classification Search
CPC .... H03F 3/19; H03F 1/0211; H03F 2200/294; H03F 2200/451; H04B 1/0053
See application file for complete search history.

(56) References Cited

U.S. PATENT DOCUMENTS 6,980,774 B2 * 12/2005 Shi ........................ H04B 1/406 455/313
8,874,050 B1 * 10/2014 Hietala ..................... H03F 3/24 330/281
9,184,701 B2 * 11/2015 Berchtold ............... H02M 3/00
9,866,178 B2 * 1/2018 Anderson .............. B82Y 10/00
10,433,054 B1 * 10/2019 Smith .................... H04R 3/007
10,903,806 B2 * 1/2021 Anderson .............. B82Y 10/00
11,011,981 B1 * 5/2021 Englekirk ............... H02M 3/07
11,496,163 B2 * 11/2022 Tanaka ..................... H03F 3/245
11,664,829 B2 * 5/2023 Jayaraman ........... H04B 1/0057 455/101
11,664,840 B2 * 5/2023 Bendlin ................... H04B 1/22 375/320
11,757,415 B2 * 9/2023 Ono .......................... H03F 1/42 455/308

(Continued)

FOREIGN PATENT DOCUMENTS

EP 3468034 A1 * 4/2019 ............... H03F 1/26
GB 2606261 A * 11/2022 ........... H03K 17/687

(Continued)

*Primary Examiner* — Hai V Nguyen
(74) *Attorney, Agent, or Firm* — McDonald Hopkins LLC

(57) ABSTRACT

A radio-frequency circuit includes a low-noise amplifier circuit, a switching circuit coupled to the input end of the low-noise amplifier circuit, a switching circuit coupled to the output end of the low-noise amplifier circuit or to the input end of the low-noise amplifier circuit via the switch circuit, a charge pump circuit configured to supply a control voltage to the switching circuit, and a charge pump circuit configured to supply a control voltage to the switching circuit.

10 Claims, 3 Drawing Sheets

(56) References Cited

U.S. PATENT DOCUMENTS

| | | | | |
|---|---|---|---|---|
| 11,764,738 | B2 * | 9/2023 | Esmael | H03F 3/211 330/296 |
| 11,811,446 | B2 * | 11/2023 | Panseri | H03F 3/19 |
| 11,881,876 | B2 * | 1/2024 | Yamaguchi | H04B 1/04 |
| 11,906,992 | B2 * | 2/2024 | Khlat | H03F 3/265 |
| 12,101,063 | B2 * | 9/2024 | Khlat | H03F 1/0222 |
| 12,184,243 | B2 * | 12/2024 | Fukasawa | H03F 1/302 |
| 12,525,934 | B2 * | 1/2026 | Chen | H03F 3/245 |
| 2005/0075088 | A1 * | 4/2005 | Ono et al. | H04B 1/30 455/252.1 |
| 2009/0004981 | A1 * | 1/2009 | Eliezer | H03F 1/3247 455/127.1 |
| 2009/0191838 | A1 * | 7/2009 | Chang | H04B 1/18 455/341 |
| 2012/0081822 | A1 * | 4/2012 | Woo | H03D 1/22 361/56 |
| 2013/0307616 | A1 * | 11/2013 | Berchtold | H03F 3/211 323/318 |
| 2016/0020737 | A1 * | 1/2016 | Kong | H01Q 21/28 330/250 |
| 2016/0218683 | A1 * | 7/2016 | Rada | H03F 3/19 |
| 2017/0077877 | A1 * | 3/2017 | Anderson | B82Y 10/00 |
| 2017/0201290 | A1 * | 7/2017 | Granger-Jones | H04B 1/0458 |
| 2019/0306621 | A1 * | 10/2019 | Smith | H04R 3/007 |
| 2020/0185875 | A1 * | 6/2020 | Allouche | G01S 17/89 |
| 2020/0220503 | A1 * | 7/2020 | Seshita | H03F 1/223 |
| 2021/0126644 | A1 * | 4/2021 | Sharma | H03M 1/0836 |
| 2021/0250054 | A1 * | 8/2021 | Tanaka | H04B 1/006 |
| 2021/0258028 | A1 * | 8/2021 | Tanaka | H04B 1/0458 |
| 2022/0006484 | A1 * | 1/2022 | Burgener | H01Q 23/00 |
| 2022/0190950 | A1 * | 6/2022 | Leung | H04B 1/109 |
| 2022/0200548 | A1 * | 6/2022 | Fukasawa | H03F 1/302 |
| 2022/0255577 | A1 * | 8/2022 | Young | H04B 1/40 |
| 2022/0345170 | A1 * | 10/2022 | Panseri | H04B 1/40 |
| 2023/0075733 | A1 * | 3/2023 | Kogure | H03F 1/0227 |
| 2023/0179233 | A1 * | 6/2023 | Kitajima | H04B 1/0057 455/552.1 |
| 2023/0238985 | A1 * | 7/2023 | Mori | H04B 1/006 455/3.04 |
| 2023/0238987 | A1 * | 7/2023 | Mori | H04B 1/0078 455/552.1 |
| 2024/0146259 | A1 * | 5/2024 | Tahara | H03F 3/195 |
| 2024/0214024 | A1 * | 6/2024 | Tsuchida | H04B 1/40 |
| 2025/0062724 | A1 * | 2/2025 | Morikawa | H03K 17/693 |
| 2025/0125828 | A1 * | 4/2025 | Nagumo | H04B 1/006 |
| 2025/0309883 | A1 * | 10/2025 | Suda | H03K 17/08122 |

FOREIGN PATENT DOCUMENTS

| | | | | |
|---|---|---|---|---|
| JP | 2022-096842 A | | 6/2022 | |
| WO | WO-2023120073 A1 | * | 6/2023 | H04B 1/006 |

* cited by examiner

RADIO-FREQUENCY CIRCUIT AND COMMUNICATION DEVICE

CROSS REFERENCE TO RELATED APPLICATION

This application claims priority from Japanese Patent Application No. 2023-022257 filed on Feb. 16, 2023. The content of this application is incorporated herein by reference in its entirety.

BACKGROUND ART

The present disclosure relates to a radio-frequency circuit and a communication device.

Japanese Unexamined Patent Application Publication No. 2022-96842 (Patent Document 1) discloses a radio-frequency circuit including switching circuits and amplifier circuits. In Patent Document 1, the switching circuits are designed to be controlled by voltages supplied by a charge pump.

BRIEF SUMMARY

However, in the known technology, the characteristics of the amplifier circuits can degrade in some cases.

The present disclosure provides a radio-frequency circuit and a communication device that enhance the characteristics of an amplifier circuit.

A radio-frequency circuit according to an aspect of the present disclosure includes a first low-noise amplifier circuit, a first switching circuit coupled to an input end of the first low-noise amplifier circuit, a second switching circuit coupled to an output end of the first low-noise amplifier circuit or to the input end of the first low-noise amplifier circuit via the first switching circuit, a first voltage supply circuit configured to supply a control voltage to the first switching circuit, and a second voltage supply circuit configured to supply a control voltage to the second switching circuit.

The radio-frequency circuit according to an aspect of the present disclosure enhances the characteristics of the amplifier circuit.

DETAILED DESCRIPTION

Figure 1:
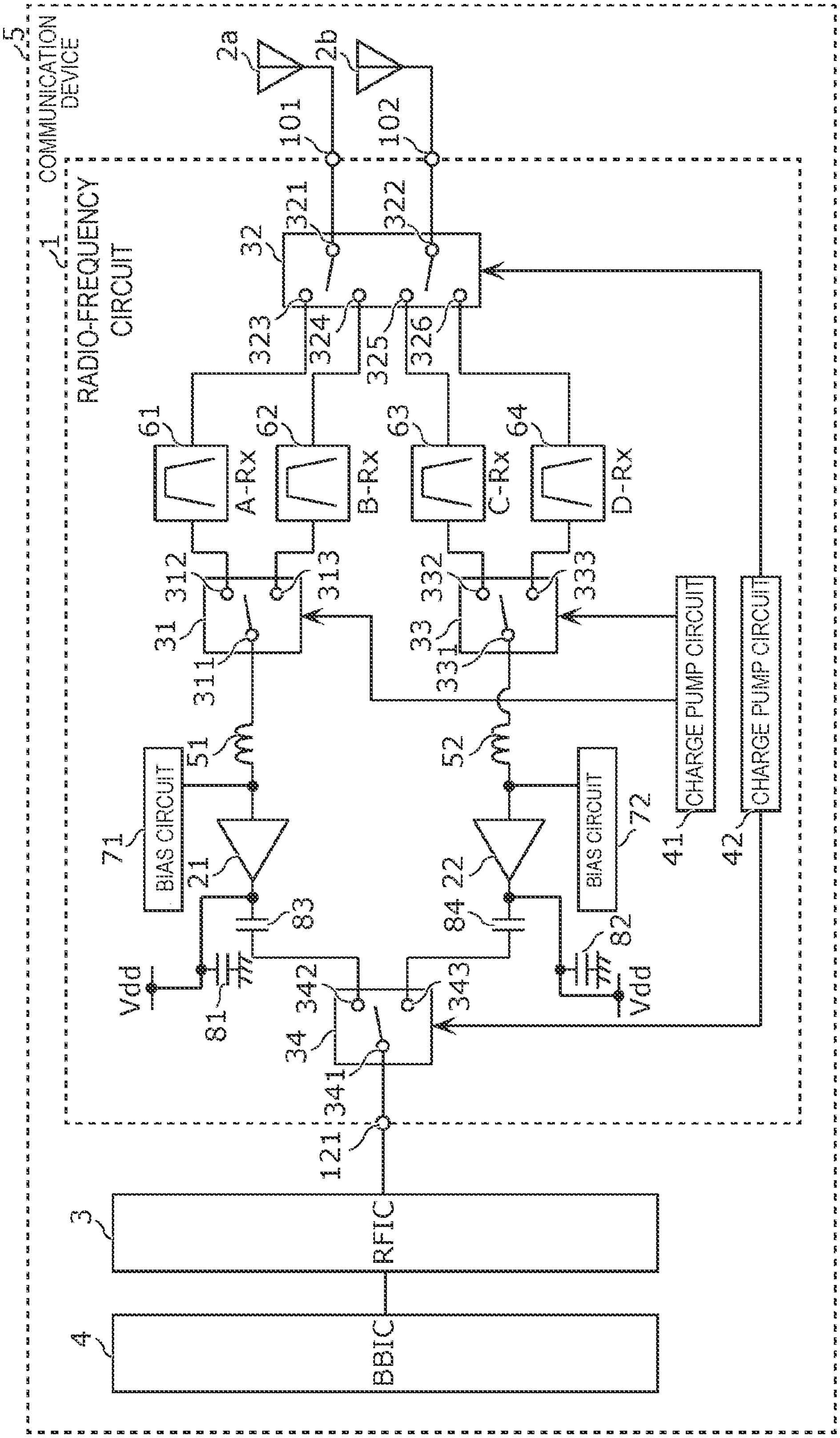
FIG. 1 is a circuit configuration diagram of a communication device according to an embodiment.

Hereinafter, embodiments of the present disclosure will be described in detail with reference to the drawings. The embodiments described below represent comprehensive or specific examples. Details, such as numerical values, shapes, materials, constituent elements, and arrangements and connection modes of the constituent elements provided in the following embodiments are illustrative and are not intended to limit the present disclosure.

The drawings are schematically illustrated with emphasis, omissions, or proportion adjustments to depict the present disclosure and do not necessarily represent exact details;

thus, the shapes, positional relationships, and proportions can differ from actual implementations. Identical reference numerals are assigned to substantially the same configuration elements across the drawings, and redundant descriptions of these configuration elements can be omitted or simplified.

In the drawings described later, the x-axis and the y-axis are perpendicular to each other in a plane parallel to the major surfaces of an integrated circuit. Specifically, when the integrated circuit is rectangular in plan view, the x-axis is parallel to a first side of the integrated circuit, and the y-axis is parallel to a second side perpendicular to the first side of the integrated circuit. The z-axis is perpendicular to the major surfaces of the integrated circuit. Along the z-axis, the positive direction indicates upward, and the negative direction indicates downward.

In the circuit configurations of the present disclosure, the term "couple" applies when one circuit element is directly coupled to another circuit element via a connection terminal and/or an interconnect conductor, and the term also applies when one circuit element is electrically couplable to another circuit element via still another circuit element. The expression "C is coupled between A and B" refers to a situation in which one end of C is coupled to A, and the other end of C is coupled to B and a situation in which C is coupled in series in the path connecting A and B. The term "path between A and B" refers to a path formed by a conductor that electrically couples A to B. The term "terminal" refers to a point at which a conductor within an element terminates. When the impedance of a conductor between elements is sufficiently low, the "terminal" can be interpreted not only as a single point but also as any point in the conductor between the elements, or as the entire conductor.

In the component layouts, the expression "A is disposed closer to C than B" refers to a situation in which the distance between A and C is shorter than the distance between B and C. As used herein, the term "distance between A (B) and C" refers to the length of the shortest line segment among the line segments that connect any given point on A (B) to any given point on C.

Terms describing relationships between elements, such as "parallel" and "vertical", terms indicating an element's shape, such as "rectangular", and numerical ranges are not meant to convey only precise meanings. These terms and numerical ranges denote meanings that are substantially the same, involving, for example, about several percent differences.

Embodiment

The following describes an embodiment.

1 Circuit Configuration of Communication Device 5

First, a circuit configuration of a communication device 5 according to the present embodiment will be described with reference to FIG. 1. FIG. 1 is a circuit configuration diagram of the communication device 5 according to the present embodiment.

FIG. 1 illustrates an exemplary circuit configuration of the communication device 5 and a radio-frequency circuit 1. The communication device 5 and the radio-frequency circuit 1 may be implemented using any of various circuit implementations and circuit techniques. Hence, the description of the communication device 5 and the radio-frequency circuit 1 provided below should not be interpreted as limiting.

The communication device 5 corresponds to a user equipment (UE) terminal for cellular communication systems, and is typically, for example, a mobile phone, smartphone, tablet computer, or wearable device. The communication device 5 may be an Internet of Things (IoT) sensor device, medical/health care device, automobile, unmanned aerial vehicle (UAV) (drone), or automated guided vehicle (AGV). The communication device 5 may be used as a base station (BS) in cellular communication systems.

As illustrated in FIG. 1, the communication device 5 includes the radio-frequency circuit 1, antennas 2*a* and 2*b*, a radio-frequency integrated circuit (RFIC) 3, and a baseband integrated circuit (BBIC) 4.

The radio-frequency circuit 1 is operable to transfer radio-frequency signals between the antennas 2*a* and 2*b* and the RFIC 3. An internal configuration of the radio-frequency circuit 1 will be described later.

The antennas 2*a* and 2*b* are respectively coupled to antenna connection terminals 101 and 102 of the radio-frequency circuit 1. The antennas 2*a* and 2*b* are operable to receive radio-frequency signals from outside and output the radio-frequency signals to the radio-frequency circuit 1. The antenna 2*a* and/or the antenna 2*b* may be operable to receive radio-frequency signals from the radio-frequency circuit 1 and output the radio-frequency signals to the outside of the communication device 5. It should be noted that the antenna 2*a* and/or the antenna 2*b* is not necessarily included in the communication device 5. The communication device 5 may also include one or more antennas in addition to the antennas 2*a* and 2*b*.

The RFIC 3 is an example of a signal processing circuit configured to process a radio-frequency signal. Specifically, the RFIC 3 is operable to process, for example by down-conversion, radio-frequency receive signals inputted through receive paths of the radio-frequency circuit 1 and output the receive signals generated by the signal processing to the BBIC 4. The RFIC 3 may also be operable to process, for example by up-conversion, transmit signals inputted from the BBIC 4 and output the radio-frequency transmit signals generated by the signal processing to the radio-frequency circuit 1. The RFIC 3 may include a control unit for controlling elements included in the radio-frequency circuit 1, such as switches and power amplifiers. The control unit may be partially or entirely provided outside the RFIC 3; for example, the control unit may be included in the BBIC 4 or the radio-frequency circuit 1.

The BBIC 4 is a baseband signal processing circuit for performing signal processing using an intermediate frequency band that is lower than radio-frequency signals transferred by the radio-frequency circuit 1. Signals such as image signals for image display and/or sound signals for calls through speakers are used as signals to be processed by the BBIC 4. It should be noted that the BBIC4 is not necessarily included in the communication device 5.

2 Circuit Configuration of Radio-Frequency Circuit 1

Next, a circuit configuration of the radio-frequency circuit 1 will be described with reference to FIG. 1. The radio-frequency circuit 1 includes low-noise amplifier circuits 21 and 22, switching circuits 31 to 34, charge pump circuits 41 and 42, inductors 51 and 52, filter circuits 61 to 64, bias circuits 71 and 72, capacitors 81 to 84, the antenna connection terminals 101 and 102, and a radio-frequency output terminal 121. In the following, the constituent elements of the radio-frequency circuit 1 will be individually described.

The antenna connection terminals 101 and 102 are external connection terminals of the radio-frequency circuit 1. Specifically, the antenna connection terminal 101 is coupled to the antenna 2*a* outside the radio-frequency circuit 1 and is coupled to the switching circuit 32 inside the radio-frequency circuit 1. The antenna connection terminal 102 is coupled to the antenna 2*b* outside the radio-frequency circuit 1 and is coupled to the switching circuit 32 inside the radio-frequency circuit 1.

The radio-frequency output terminal 121 is an external connection terminal of the radio-frequency circuit 1. Specifically, the radio-frequency output terminal 121 is coupled to the RFIC 3 outside the radio-frequency circuit 1 and is coupled to the switching circuit 34 inside the radio-frequency circuit 1.

The low-noise amplifier circuit 21 is an example of a first low-noise amplifier circuit. The low-noise amplifier circuit 21 includes an amplifier transistor. In the present embodiment, a field-effect transistor (FET) is used as the amplifier transistor. However, the amplifier transistor is not limited to a FET. The input end of the low-noise amplifier circuit 21 is coupled to the switching circuit 31 via the inductor 51. The output end of the low-noise amplifier circuit 21 is coupled to the switching circuit 34 via the capacitor 83. The low-noise amplifier circuit 21 is operable to amplify receive signals in bands A and B that have passed through the filter circuits 61 and 62 using a supply voltage Vdd.

The low-noise amplifier circuit 22 is an example of a second low-noise amplifier circuit. The low-noise amplifier circuit 22 includes an amplifier transistor. In the present embodiment, a FET is used as the amplifier transistor. However, the amplifier transistor is not limited to a FET. The input end of the low-noise amplifier circuit 22 is coupled to the switching circuit 33 via the inductor 52. The output end of the low-noise amplifier circuit 22 is coupled to the switching circuit 34 via the capacitor 84. The low-noise amplifier circuit 22 is operable to amplify receive signals in bands C and D that have passed through the filter circuits 63 and 64 using the supply voltage Vdd. It should be noted that the low-noise amplifier circuit 22 is not necessarily included in the radio-frequency circuit 1.

The switching circuit 31 is an example of a first switching circuit. The switching circuit 31 is coupled to the input end of the low-noise amplifier circuit 21 without necessarily involving any switching circuit. Specifically, the switching circuit 31 has a terminal 311 coupled to the low-noise amplifier circuit 21 via the inductor 51, a terminal 312 coupled to the filter circuit 61, and a terminal 313 coupled to the filter circuit 62. With this connection configuration, the switching circuit 31 is operable to exclusively connect the terminal 311 to the terminals 312 and 313, in response to a control voltage supplied from the charge pump circuit 41. In other words, the switching circuit 31 is operable to switch the connection of the low-noise amplifier circuit 21 between the filter circuits 61 and 62. The switching circuit 31 is implemented by, for example, a single-pole double-throw (SPDT) switching circuit including multiple FETs.

The switching circuit 32 is an example of a second switching circuit. The switching circuit 32 is coupled to the input end of the low-noise amplifier circuit 21 via the switching circuit 31 and to the input end of the low-noise amplifier circuit 22 via the switching circuit 33. Specifically, the switching circuit 32 has a terminal 321 coupled to the antenna connection terminal 101, a terminal 322 coupled to the antenna connection terminal 102, a terminal 323 coupled to the filter circuit 61, a terminal 324 coupled to the filter circuit 62, a terminal 325 coupled to the filter circuit 63, and a terminal 326 coupled to the filter circuit 64. With this connection configuration, the switching circuit 32 is operable to connect the terminals 321 and 322 to the terminals 323 to 326 in response to a control voltage supplied from the charge pump circuit 42. In other words, the switching circuit 32 is operable to switch the connection of the antenna connection terminal 101 and the connection of the antenna connection terminal 102 among the filter circuits 61 to 64. The switching circuit 32 is implemented by, for example, a multi-connection switching circuit including multiple FETs. It should be noted that the switching circuit 32 is not necessarily included in the radio-frequency circuit 1.

The switching circuit 33 is an example of a third switching circuit. The switching circuit 33 is coupled to the input end of the low-noise amplifier circuit 22 without necessarily involving any switching circuit. Specifically, the switching circuit 33 has a terminal 331 coupled to the low-noise amplifier circuit 22 via the inductor 52, a terminal 332 coupled to the filter circuit 63, and a terminal 333 coupled to the filter circuit 64. With this connection configuration, the switching circuit 33 is operable to exclusively connect the terminal 331 to the terminals 332 and 333, in response to a control voltage supplied from the charge pump circuit 41. In other words, the switching circuit 33 is operable to switch the connection of the low-noise amplifier circuit 22 between the filter circuits 63 and 64. The switching circuit 33 is implemented by, for example, a SPDT switching circuit including multiple FETs. It should be noted that the switching circuit 33 is not necessarily included in the radio-frequency circuit 1.

The switching circuit 34 is an example of a second switching circuit. The switching circuit 34 is coupled to the output end of the low-noise amplifier circuit 21 and the output end of the low-noise amplifier circuit 22. Specifically, the switching circuit 34 has a terminal 341 coupled to the radio-frequency output terminal 121, a terminal 342 coupled to the output end of the low-noise amplifier circuit 21 via the capacitor 83, and a terminal 343 coupled to the output end of the low-noise amplifier circuit 22 via the capacitor 84. With this connection configuration, the switching circuit 34 is operable to connect the terminal 341 to the terminals 342 and 343 in response to a control voltage supplied from the charge pump circuit 42. The switching circuit 34 is implemented by, for example, a multi-connection switching circuit including multiple FETs. It should be noted that the switching circuit 34 is not necessarily included in the radio-frequency circuit 1.

The charge pump circuit 41 is an example of a first voltage supply circuit. The charge pump circuit 41 is operable to supply a control voltage to the switching circuits 31 and 33. The circuit configuration of the charge pump circuit 41 will be described later with reference to FIG. 2.

The charge pump circuit 42 is an example of a second voltage supply circuit. The charge pump circuit 42 is operable to supply a control voltage to the switching circuits 32 and 34.

The inductor 51 is coupled between the input end of the low-noise amplifier circuit 21 and the terminal 311 of the switching circuit 31. The inductor 51 is operable to provide impedance matching between the low-noise amplifier circuit 21 and the switching circuit 31. It should be noted that the inductor 51 is not necessarily included in the radio-frequency circuit 1.

The inductor 52 is coupled between the input end of the low-noise amplifier circuit 22 and the terminal 331 of the switching circuit 33. The inductor 52 is operable to provide impedance matching between the low-noise amplifier circuit 22 and the switching circuit 33. It should be noted that the inductor 52 is not necessarily included in the radio-frequency circuit 1.

The filter circuit 61 is an example of a capacitive element coupled between the switching circuits 31 and 32. Specifically, the filter circuit 61 is an acoustic wave filter that has a pass band including a receive frequency range of the band A (A-Rx). One end of the filter circuit 61 is coupled to the switching circuit 31, and the other end of the filter circuit 61 is coupled to the switching circuit 32. It should be noted that the filter circuit 61 is not necessarily included in the radio-frequency circuit 1.

The filter circuit 62 is an example of a capacitive element coupled between the switching circuits 31 and 32. Specifically, the filter circuit 62 is an acoustic wave filter that has a pass band including a receive frequency range of the band B (B-Rx). One end of the filter circuit 62 is coupled to the switching circuit 31, and the other end of the filter circuit 62 is coupled to the switching circuit 32. It should be noted that the filter circuit 62 is not necessarily included in the radio-frequency circuit 1.

The filter circuit 63 is an example of a capacitive element coupled between the switching circuits 33 and 32. Specifically, the filter circuit 63 is an acoustic wave filter that has a pass band including a receive frequency range of the band C (C-Rx). One end of the filter circuit 63 is coupled to the switching circuit 33, and the other end of the filter circuit 63 is coupled to the switching circuit 32. It should be noted that the filter circuit 63 is not necessarily included in the radio-frequency circuit 1.

The filter circuit 64 is an example of a capacitive element coupled between the switching circuits 33 and 32. Specifically, the filter circuit 64 is an acoustic wave filter that has a pass band including a receive frequency range of the band D (D-Rx). One end of the filter circuit 64 is coupled to the switching circuit 33, and the other end of the filter circuit 64 is coupled to the switching circuit 32. It should be noted that the filter circuit 64 is not necessarily included in the radio-frequency circuit 1.

The filter circuits 61 to 64 are not necessarily acoustic wave filters. For example, one, some or all of the filter circuits 61 to 64 may be LC filters. In these cases, the capacitors included in the LC filters functions as capacitive elements.

The bands A to D represent frequency bands for communication systems that are built using radio access technologies (RAT), determined by, for example, standards organizations such as the 3rd Generation Partnership Project (3GPP, registered trademark) and the Institute of Electrical and Electronics Engineers (IEEE)). Examples of the communication systems include a 5th Generation New Radio (5GNR) system, a Long-Term Evolution (LTE) system, and a wireless local area network (WLAN) system. The bands A to D may represent frequency bands that are different from or identical to each other. For example, the bands A and C may represent an identical band, and the bands B and D may represent an identical band.

The bias circuit 71 is operable to supply a bias signal to the low-noise amplifier circuit 21, for example, in response to a control signal supplied by the RFIC 3.

The bias circuit 72 is operable to supply a bias signal to the low-noise amplifier circuit 22, for example, in response to a control signal supplied by the RFIC 3.

The capacitor 81 is a bypass capacitor, or a decoupling capacitor. The capacitor 81 is coupled between the path for supplying the supply voltage Vdd to the low-noise amplifier circuit 21 and ground.

The capacitor 82 is a bypass capacitor, or a decoupling capacitor. The capacitor 82 is coupled between the path for supplying the supply voltage Vdd to the low-noise amplifier circuit 22 and ground.

The capacitor 83 is a direct-current (DC) blocking capacitor, or a coupling capacitor. The capacitor 83 is coupled between the output end of the low-noise amplifier circuit 21 and the terminal 342 of the switching circuit 34. No DC blocking capacitor is coupled between the terminal 311 of the switching circuit 31 and the input end of the low-noise amplifier circuit 21.

The capacitor 84 is a DC blocking capacitor, or a coupling capacitor. The capacitor 84 is coupled between the output end of the low-noise amplifier circuit 22 and the terminal 343 of the switching circuit 34.

In the present embodiment, the low-noise amplifier circuits 21 and 22, the switching circuits 31 to 34, the charge pump circuits 41 and 42, the bias circuits 71 and 72, and the capacitors 81 and 82 are integrated into one integrated circuit. This integrated circuit will be described later with reference to FIG. 3.

The circuit configuration of the radio-frequency circuit 1 is illustrative, and the circuit configuration in FIG. 1 is not to be interpreted as limiting. For example, the radio-frequency circuit 1 may additionally include one or more filter circuits. In this case, the one or more filter circuits may be coupled between the switching circuits 32 and 31, or between the switching circuits 32 and 33.

3 Circuit Configuration of Charge Pump Circuit 41

Figure 2:
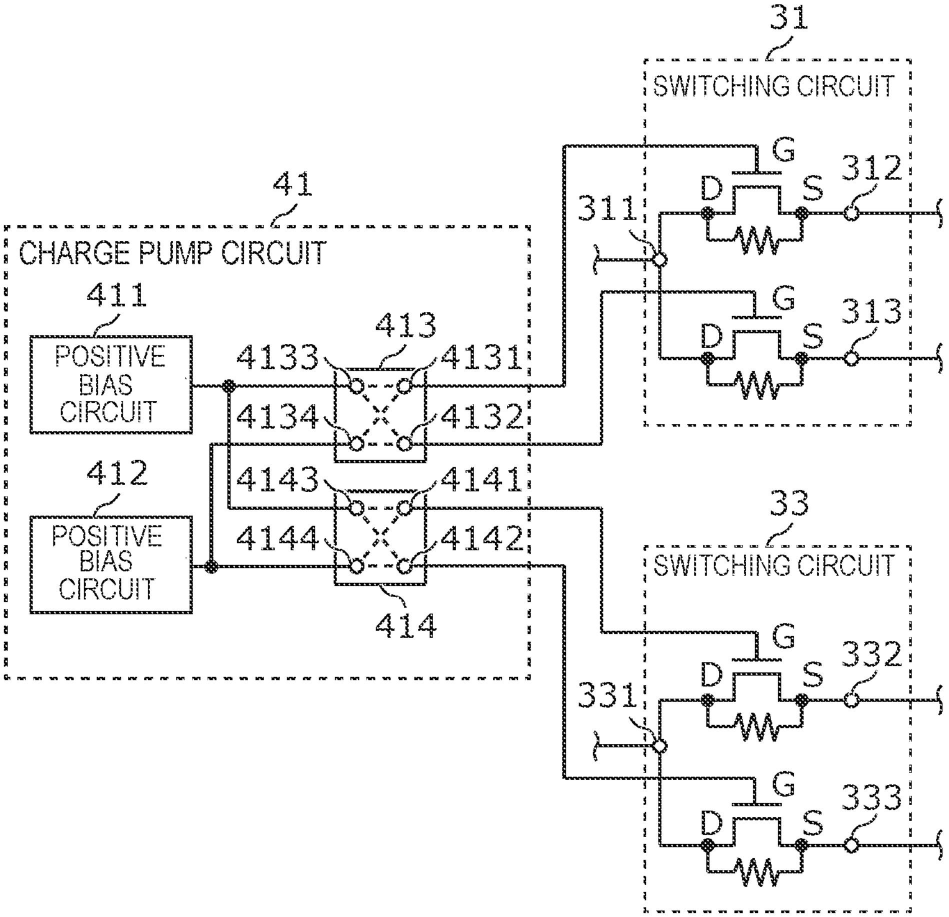
FIG. 2 is a circuit configuration diagram of a charge pump circuit and switching circuits according to the embodiment.

Next, a circuit configuration of the charge pump circuit 41 will be described with reference to FIG. 2. FIG. 2 is a circuit configuration diagram of the charge pump circuit 41 and the switching circuits 31 and 33 according to the present embodiment. The circuit configuration of the charge pump circuit 42 is the same as the circuit configuration of the charge pump circuit 41, and the illustration and description of the charge pump circuit 42 are omitted.

FIG. 2 illustrates an exemplary circuit configuration of the charge pump circuit 41 and the switching circuits 31 and 33. The charge pump circuit 41 and the switching circuits 31 and 33 may be implemented using any of various circuit implementations and circuit techniques. Hence, the description of the charge pump circuit 41 and the switching circuits 31 and 33 provided below should not be interpreted as limiting.

As illustrated in FIG. 2, the charge pump circuit 41 includes a positive bias circuit 411, a negative bias circuit 412, and switching circuits 413 and 414.

The positive bias circuit 411 includes a step-up circuit, a step-down circuit, an inverting circuit, or any combination thereof. The positive bias circuit 411 is coupled to the switching circuits 413 and 414. The positive bias circuit 411 is operable to output a positive bias by increasing, decreasing, or inverting an input voltage, or performing any combination of these operations on the input voltage, using a pulse wave generated by an oscillator (not illustrated in the drawing).

The negative bias circuit 412 includes a step-up circuit, a step-down circuit, an inverting circuit, or any combination thereof. The positive bias circuit 412 is coupled to the switching circuits 413 and 414. The negative bias circuit 412 is operable to output a negative bias by increasing, decreasing, or inverting an input voltage, or performing any combination of these operations on the input voltage, using a pulse wave generated by an oscillator (not illustrated in the drawing).

The switching circuit 413 is coupled between the positive bias circuit 411 and the negative bias circuit 412, and the switching circuit 31. Specifically, the switching circuit 413 has a terminal 4131 coupled to a FET configured to connect or disconnect the path between the terminals 311 and 312 of the switching circuit 31, a terminal 4132 coupled to a FET configured to connect or disconnect the path between the terminals 311 and 313 of the switching circuit 31, a terminal 4133 coupled to the positive bias circuit 411, and a terminal 4134 coupled to the negative bias circuit 412. With this connection configuration, the switching circuit 413 is operable to exclusively connect the terminal 4131 to the terminals 4133 and 4134 and to exclusively connect the terminal 4132 to the terminals 4133 and 4134. In other words, the switching circuit 413 is operable to switch the connection of the gate terminal of each FET of the switching circuit 31 between the positive bias circuit 411 and the negative bias circuit 412. The switching circuit 413 is implemented by, for example, a double-pole double-throw (DPDT) switching circuit.

The switching circuit 414 is coupled between the positive bias circuit 411 and the negative bias circuit 412, and the switching circuit 33. Specifically, the switching circuit 414 has a terminal 4141 coupled to a FET configured to connect or disconnect the path between the terminals 331 and 332 of the switching circuit 33, a terminal 4142 coupled to a FET configured to connect or disconnect the path between the terminals 331 and 333 of the switching circuit 33, a terminal 4143 coupled to the positive bias circuit 411, and a terminal 4144 coupled to the negative bias circuit 412. With this connection configuration, the switching circuit 414 is operable to exclusively connect the terminal 4141 to the terminals 4143 and 4144 and to exclusively connect the terminal 4142 to the terminals 4143 and 4144. In other words, the switching circuit 414 is operable to switch the connection of the gate terminal of each FET of the switching circuit 33 between the positive bias circuit 411 and the negative bias circuit 412. The switching circuit 414 is implemented by, for example, a DPDT switching circuit.

The circuit configuration of the charge pump circuit 41 is illustrative, and the circuit configuration in FIG. 2 is not to be interpreted as limiting. For example, it may be possible that the charge pump circuit 41 does not include either the positive bias circuit 411 or the negative bias circuit 412. In this case, either a positive bias or a negative bias, and a ground voltage are supplied to the switching circuits 31 and 33. The charge pump circuit 41 may include, for example, a bandgap reference circuit (not illustrated in the drawing) and an error amplifier circuit (not illustrated in the drawing).

Although in the present embodiment a charge pump circuit is used as a voltage supply circuit, the voltage supply circuit is not limited to a charge pump circuit. For example, a bootstrap circuit and/or a switched capacitor circuit may be used as the voltage supply circuit.

4 Circuit Layout of Integrated Circuit 10

Figure 3:
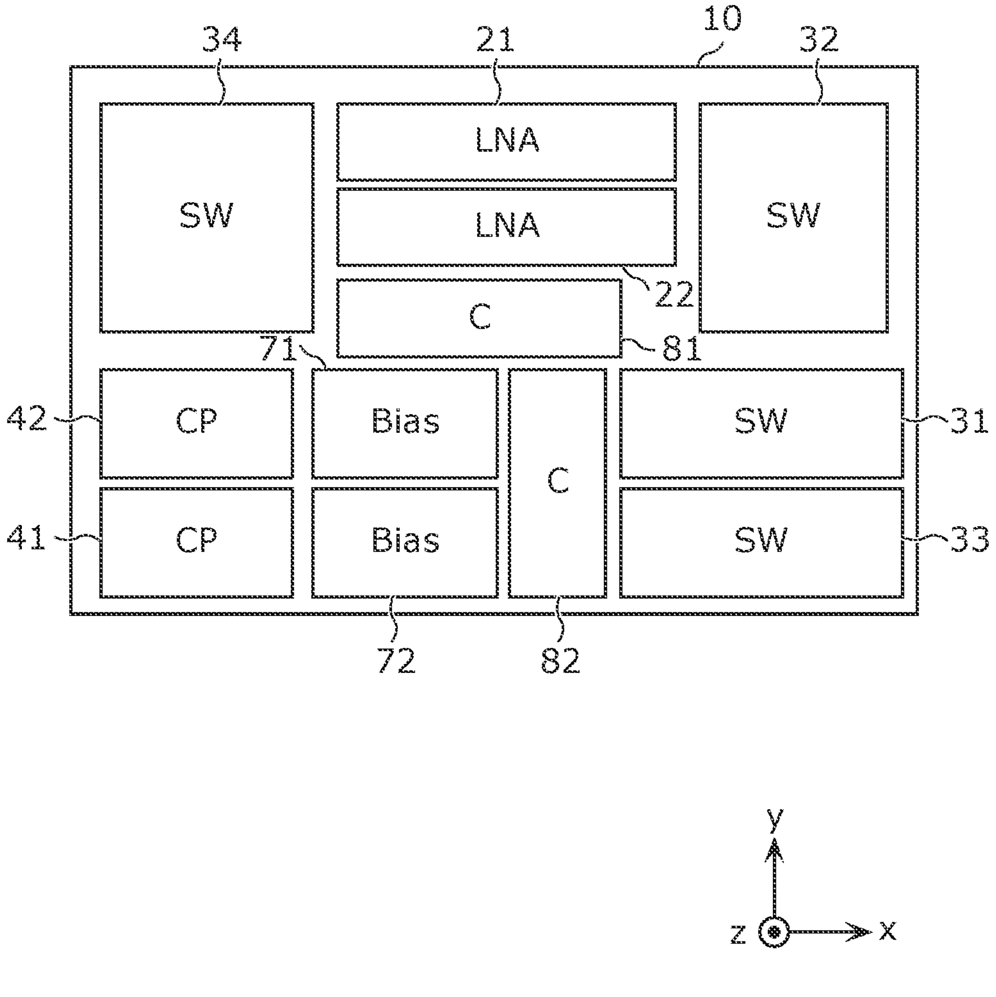
FIG. 3 is a circuit layout diagram of an integrated circuit according to the embodiment.

Next, a circuit layout of an integrated circuit 10 will be described with reference to FIG. 3. FIG. 3 is a circuit layout diagram of the integrated circuit 10 according to the present embodiment. In FIG. 3, to simplify understanding of the positional relationships of the circuits, each circuit is labeled with letters (for example, "LNA") representing the circuit. However, these letters are not necessarily marked on the actual components.

FIG. 3 illustrates an exemplary circuit layout of the integrated circuit 10. The integrated circuit 10 may be implemented using any of various circuit implementations and circuit techniques. Hence, the description of the integrated circuit 10 provided below should not be interpreted as limiting.

The integrated circuit 10 is a semiconductor integrated circuit that includes the low-noise amplifier circuits 21 and 22 (LNA), the switching circuits 31 to 34 (SW), the charge pump circuits 41 and 42 (CP), the bias circuits 71 and 72 (Bias), and the capacitors 81 and 82 (C).

In the integrated circuit 10, the switching circuit 34 is disposed closer to each of the charge pump circuits 41 and 42 than the switching circuits 31 to 33. In other words, the charge pump circuits 41 and 42 are disposed away from the switching circuits 31 to 33 and close to the switching circuit 34.

The charge pump circuit 41 is formed in a region that is different from the charge pump circuit 42. In FIG. 3, the charge pump circuit 41 is adjacent to the charge pump circuit 42. One or some elements may be shared by the charge pump circuits 41 and 42.

The circuit layout of the integrated circuit 10 is illustrative, and the circuit layout in FIG. 3 is not to be interpreted as limiting. For example, the integrated circuit 10 may include the capacitors 83 and 84. The integrated circuit 10 may include a logical circuit configured to control the charge pump circuits 41 and 42 in response to digital control signals supplied by the RFIC 3.

5 Effects

As described above, the radio-frequency circuit 1 according to the present embodiment includes the low-noise amplifier circuit 21, the switching circuit 31 coupled to the input end of the low-noise amplifier circuit 21, the switching circuit 32 or 34 coupled to the output end of the low-noise amplifier circuit 21 or to the input end of the low-noise amplifier circuit 21 via the switch circuit 31, the charge pump circuit 41 configured to supply a control voltage to the switching circuit 31, and the charge pump circuit 42 configured to supply a control voltage to the switching circuit 32 or 34.

With this configuration, different charge pump circuits, specifically the charge pump circuits 41 and 42, can supply control voltages to the switching circuit 31 and the switching circuit 32 or 34. Typically, when a charge pump circuit supplies control voltages to multiple switching circuits, the control voltage supplied to a first switching circuit varies with changes in the control voltage supplied to a second switching circuit. Accordingly, the on-resistance of the first switching circuit varies. The charge pump circuit 41 that supplies a control voltage to the switching circuit 31 is different from the charge pump circuit 42 for the switching circuit 32 or 34. Supplying control voltages in this manner suppresses the variation in the on-resistance of the switching circuit 31 due to changes in the control voltage for the switching circuit 32 or 34. As a result, the variation in the bias voltage for the low-noise amplifier circuit 21 coupled to the switching circuit 31 can be suppressed. Consequently, the variation in the gain of the low-noise amplifier circuit 21 can be suppressed. This means that this configuration increases the uniformity of the gain of the low-noise amplifier circuit 21, thereby improving the characteristics of the low-noise amplifier circuit 21 (for example, noise figure (NF)). Especially when the path between the input end of the low-noise amplifier circuit 21 and the switching circuit 31 cannot be DC grounded (specifically, no DC blocking capacitor is provided in the path), the variation in the on-resistance of the switching circuit 31 greatly affects the bias voltage for the low-noise amplifier circuit 21. Thus, in this case, the improvement of the characteristics of the low-noise amplifier circuit 21 becomes significant.

In an example, in the radio-frequency circuit 1 according to the present embodiment, the switching circuit 31 may be coupled to the input end of the low-noise amplifier circuit 21 without necessarily involving any switching circuit.

With this configuration, the variation in the on-resistance of the switching circuit 31 directly affects the variation in the bias voltage for the low-noise amplifier circuit 21. Thus, the improvement of the characteristics of the low-noise amplifier circuit 21 becomes significant.

In an example, the radio-frequency circuit 1 according to the present embodiment may further include the inductor 51 coupled between the switching circuit 31 and the input end of the low-noise amplifier circuit 21.

With this configuration, impedance matching can be provided between the switching circuit 31 and the input end of the low-noise amplifier circuit 21.

In an example, in the radio-frequency circuit 1 according to the present embodiment, it may be possible that no capacitor is coupled between the switching circuit 31 and the input end of the low-noise amplifier circuit 21.

Since no capacitor (DC blocking capacitor) is coupled between the input end of the low-noise amplifier circuit 21 and the switching circuit 31, the inductance coupled to the input end of the low-noise amplifier circuit 21 to provide impedance matching can be reduced. Thus, this configuration improves the characteristics of the low-noise amplifier circuit 21. However, since no capacitor (DC blocking capacitor) is coupled between the input end of the low-noise amplifier circuit 21 and the switching circuit 31, the path between the input end of the low-noise amplifier circuit 21 and the switching circuit 31 cannot be DC grounded. As a result, the uniformity of the bias voltage decreases. In such a case, the variation in the on-resistance of the switching circuit 31 greatly affects the bias voltage of the low-noise amplifier circuit 21. For this reason, the effect of reducing the variation in the on-resistance of the switching circuit 31 becomes significant.

In an example, in the radio-frequency circuit 1 according to the present embodiment, the switching circuit 32 may be coupled to the input end of the low-noise amplifier circuit 21 via the switching circuit 31; and the radio-frequency circuit 1 may further include a capacitive element coupled between the switching circuits 31 and 32.

With this configuration, the capacitive element is capable of blocking DC components, thereby providing DC grounding for the path between the switching circuits 31 and 32. This configuration decreases the influence of the variation in the on-resistance of the switching circuit 32 on the bias voltage of the low-noise amplifier circuit 21, thereby suppressing degradation of the characteristics of the low-noise amplifier circuit 21.

In an example, in the radio-frequency circuit 1 according to the present embodiment, the capacitive element may be an acoustic wave filter (for example, the filter circuits 61 and 62).

This configuration eliminates the need for additional capacitive elements for DC component blocking, thereby reducing the number of components.

In an example, the radio-frequency circuit 1 according to the present embodiment may further include the low-noise amplifier circuit 22 and the switching circuit 33 coupled to the input end of the low-noise amplifier circuit 22; the charge pump circuit 41 may be configured to supply a control voltage to the switching circuit 33.

With this configuration, the charge pump circuit 41 can be shared by the switching circuits 31 and 33. As a result, the number of charge pump circuits can be reduced.

In an example, in the radio-frequency circuit 1 according to the present embodiment, the switching circuit 34 may be coupled to the output end of the low-noise amplifier circuit 21; the low-noise amplifier circuit 21, the switching circuits 31 and 34, and the charge pump circuits 41 and 42 may be integrated into the same integrated circuit 10; and the switching circuit 34 may be disposed closer to each of the charge pump circuits 41 and 42 than the switching circuit 31 in the integrated circuit 10.

With this configuration, the charge pump circuits 41 and 42, which can generate noise, are disposed relatively distant from the switching circuit 31. This configuration thus reduces the likelihood of noise leakage to the input side of the low-noise amplifier circuit 21.

The communication device 5 according to the present embodiment includes the RFIC 3 configured to process a radio-frequency signal and the radio-frequency circuit 1 configured to transfer the radio-frequency signal between the RFIC 3 and the antennas 2*a* and 2*b*.

This configuration enables the communication device 5 to achieve the same effects as the radio-frequency circuit 1.

Other Embodiments

The radio-frequency circuit and the communication device according to the present disclosure have been described above based on the embodiment. However, the radio-frequency circuit and the communication device according to the present disclosure are not limited to the embodiment. The present disclosure also embraces other practical examples implemented by any combination of the constituent elements of the embodiment, other modifications obtained by making various modifications that occur to those skilled in the art without necessarily departing from the scope of the embodiment, and various hardware devices including the radio-frequency circuit.

For example, in the circuit configuration of the radio-frequency circuit according to the embodiment described above, other circuit elements and/or interconnections may also be inserted in the paths connecting the circuit elements and the signal paths that are illustrated in the drawings. For example, an impedance matching circuit may be inserted between the filter and the antenna connection terminal.

The following describes the features of the radio-frequency circuit and the communication device explained based on the embodiment.

<1>

A radio-frequency circuit comprising:

a first low-noise amplifier circuit;

a first switching circuit coupled to an input end of the first low-noise amplifier circuit;

a second switching circuit coupled to an output end of the first low-noise amplifier circuit or to the input end of the first low-noise amplifier circuit via the first switching circuit;

a first voltage supply circuit configured to supply a control voltage to the first switching circuit; and a second voltage supply circuit configured to supply a control voltage to the second switching circuit.

<2>

The radio-frequency circuit according to <1>, wherein the first switching circuit is coupled to the input end of the first low-noise amplifier circuit without necessarily involving any switching circuit.

<3>

The radio-frequency circuit according to <2>, further comprising an inductor coupled between the first switching circuit and the input end of the first low-noise amplifier circuit.

<4>

The radio-frequency circuit according to <3>, wherein no capacitor is coupled between the first switching circuit and the input end of the first low-noise amplifier circuit.

<5>

The radio-frequency circuit according to any one of <1> to <4>, wherein the second switching circuit is coupled to the input end of the first low-noise amplifier circuit via the first switching circuit, the radio-frequency circuit further comprising a capacitive element coupled between the first switching circuit and the second switching circuit.

<6>

The radio-frequency circuit according to <5>, wherein the capacitive element is an acoustic wave filter.

<7>

The radio-frequency circuit according to any one of <1> to <6>, further comprising:

a second low-noise amplifier circuit; and a third switching circuit coupled to an input end of the second low-noise amplifier circuit, wherein the first voltage supply circuit is further configured to supply a control voltage to the third switching circuit.

<8>

The radio-frequency circuit according to any one of <1> to <4>, wherein the second switching circuit is coupled to the output end of the first low-noise amplifier circuit, the first low-noise amplifier circuit, the first switching circuit, the second switching circuit, the first voltage supply circuit, and the second voltage supply circuit are integrated into the same integrated circuit, and the second switching circuit is disposed closer to each of the first voltage supply circuit and the second voltage supply circuit than the first switching circuit in the integrated circuit.

<9>

A communication device comprising:

a signal processing circuit configured to process a radio-frequency signal; and the radio-frequency circuit according to any one of <1> to <8>, the radio-frequency circuit being configured to transfer the radio-frequency signal between the signal processing circuit and an antenna.

The present disclosure can be used as a radio-frequency circuit provided at the front-end in a wide variety of communication devices such as mobile phones.

What is claimed is:

1. A radio-frequency circuit comprising:

a first low-noise amplifier circuit;

a first switching circuit coupled to an input of the first low-noise amplifier circuit;

a second switching circuit coupled to an output of the first low-noise amplifier circuit, or coupled to the input of the first low-noise amplifier circuit via the first switching circuit;

a first voltage supply circuit configured to supply a first control voltage to the first switching circuit; and a second voltage supply circuit configured to supply a second control voltage to the second switching circuit, wherein the first voltage supply circuit and the second voltage supply circuit are different from each other.

2. The radio-frequency circuit according to claim 1, wherein the first switching circuit is coupled to the input of the first low-noise amplifier circuit without a switching circuit therebetween.

3. The radio-frequency circuit according to claim 2, further comprising:

an inductor coupled between the first switching circuit and the input of the first low-noise amplifier circuit.

4. The radio-frequency circuit according to claim 3, wherein no capacitor is coupled between the first switching circuit and the input of the first low-noise amplifier circuit.

5. The radio-frequency circuit according to claim 1, wherein the second switching circuit is coupled to the input of the first low-noise amplifier circuit via the first switching circuit, and wherein the radio-frequency circuit further comprises a capacitive circuit element coupled between the first switching circuit and the second switching circuit.

6. The radio-frequency circuit according to claim 5, wherein the capacitive circuit element is an acoustic wave filter.

7. The radio-frequency circuit according to claim 1, further comprising:

a second low-noise amplifier circuit; and a third switching circuit coupled to an input of the second low-noise amplifier circuit, wherein the first voltage supply circuit is further configured to supply a third control voltage to the third switching circuit.

8. The radio-frequency circuit according to claim 1, wherein the second switching circuit is coupled to the output of the first low-noise amplifier circuit, wherein the first low-noise amplifier circuit, the first switching circuit, the second switching circuit, the first voltage supply circuit, and the second voltage supply circuit are integrated into the same integrated circuit, and wherein, within the integrated circuit, the second switching circuit is closer to each of the first voltage supply circuit and the second voltage supply circuit than the first switching circuit.

9. A communication device comprising:

a signal processing circuit configured to process a radio-frequency signal; and the radio-frequency circuit according to claim 1, the radio-frequency circuit being configured to transfer the radio-frequency signal between the signal processing circuit and an antenna.

10. The radio-frequency circuit according to claim 1, wherein the first low-noise amplifier circuit, the first switching circuit, the second switching circuit, the first voltage supply circuit, and the second voltage supply circuit are integrated into the same integrated circuit, and wherein, within the integrated circuit, the second switching circuit is closer to the second voltage supply circuit and the first low-noise amplifier circuit than the first switching circuit.

* * * * *